United States Patent
Tobita

[11] Patent Number: 5,717,324
[45] Date of Patent: Feb. 10, 1998

[54] INTERMEDIATE POTENTIAL GENERATION CIRCUIT

[75] Inventor: Youichi Tobita, Tokyo, Japan

[73] Assignee: Mitsubishi Denki Kabushiki Kaisha, Tokyo, Japan

[21] Appl. No.: 763,283

[22] Filed: Dec. 10, 1996

[30] Foreign Application Priority Data

Dec. 11, 1995 [JP] Japan .................. 7-321760

[51] Int. Cl.$^6$ ........................... G05F 3/16
[52] U.S. Cl. ........................... 323/313; 323/314
[58] Field of Search ........................... 323/313, 314

[56] References Cited

U.S. PATENT DOCUMENTS

| | | | |
|---|---|---|---|
| Re. 34,290 | 6/1993 | Tobita | 323/313 |
| 3,805,095 | 4/1974 | Lee et al. | 307/304 |
| 3,823,332 | 7/1974 | Feryszka et al. | 323/313 |
| 4,559,548 | 12/1985 | Iizuka et al. | 363/60 |
| 4,663,584 | 5/1987 | Okada et al. | 323/313 |
| 4,670,706 | 6/1987 | Tobita | 323/313 |
| 4,692,689 | 9/1987 | Takamae | 323/313 |
| 4,788,455 | 11/1988 | Mori et al. | 323/314 |
| 4,812,735 | 3/1989 | Sawada et al. | 323/313 |
| 4,814,686 | 3/1989 | Watanabe | 323/313 |
| 4,906,914 | 3/1990 | Ohsawa | 323/314 |
| 4,947,056 | 8/1990 | Jinbo | 323/313 |
| 5,528,130 | 6/1996 | Okamura | 323/314 |
| 5,610,550 | 3/1997 | Furutani | 323/314 |

FOREIGN PATENT DOCUMENTS

| | | | |
|---|---|---|---|
| 57-157315 | 9/1982 | Japan | G05F 1/56 |
| 62-85669 | 4/1987 | Japan | H02M 3/07 |

*Primary Examiner*—Jeffrey L. Sterrett
*Attorney, Agent, or Firm*—Lowe, Price, LeBlanc & Becker

[57] ABSTRACT

An intermediate potential generation circuit having a controlled potential generation circuit including a voltage division circuit connected between a source potential node and a ground potential node, and generating first and second output potentials which deviate slightly from each other on both sides of the level of an intermediate potential. An N channel MOS transistor is connected between the source potential node and an intermediate potential output node, and has its gate receiving the potential corresponding to the first output potential. A P channel MOS transistor is connected between the intermediate potential output node and the ground potential node, and has its gate receiving the potential corresponding to the second output potential. The back gate of either one of the two MOS transistors is connected to the gate thereof.

7 Claims, 8 Drawing Sheets

$$V_{th}=V_o+K(\sqrt{2\phi F+V_{BS}} - \sqrt{2\phi F})$$

INTERMEDIATE POTENTIAL GENERATION CIRCUIT

TECHNICAL FIELD

The present invention relates to a semiconductor integrated circuit and, more particularly, to a semiconductor integrated circuit including an improved intermediate potential generation circuit utilizing the threshold voltage of a diode-connected MOS transistor.

BACKGROUND ART

These days, under the background of the wide and rapid spread of portable equipment such as notebook-type personal computers, cellular phones, personal handy phones, etc., there is an increasing demand for semiconductor integrated circuits having low power consumption. As a method for achieving low power consumption, it has been common to operate a semiconductor integrated circuit with a power source of low voltage. When driving a semiconductor integrated circuit with a low voltage power source, however, there arises a disadvantage that the ratio of a voltage drop brought by the threshold voltage of MOS transistor to a source potential is large, and it becomes difficult to achieve a potential adjustment utilizing a voltage drop brought by the threshold voltage of MOS transistor, which seriously affects circuit design.

Figure 10:
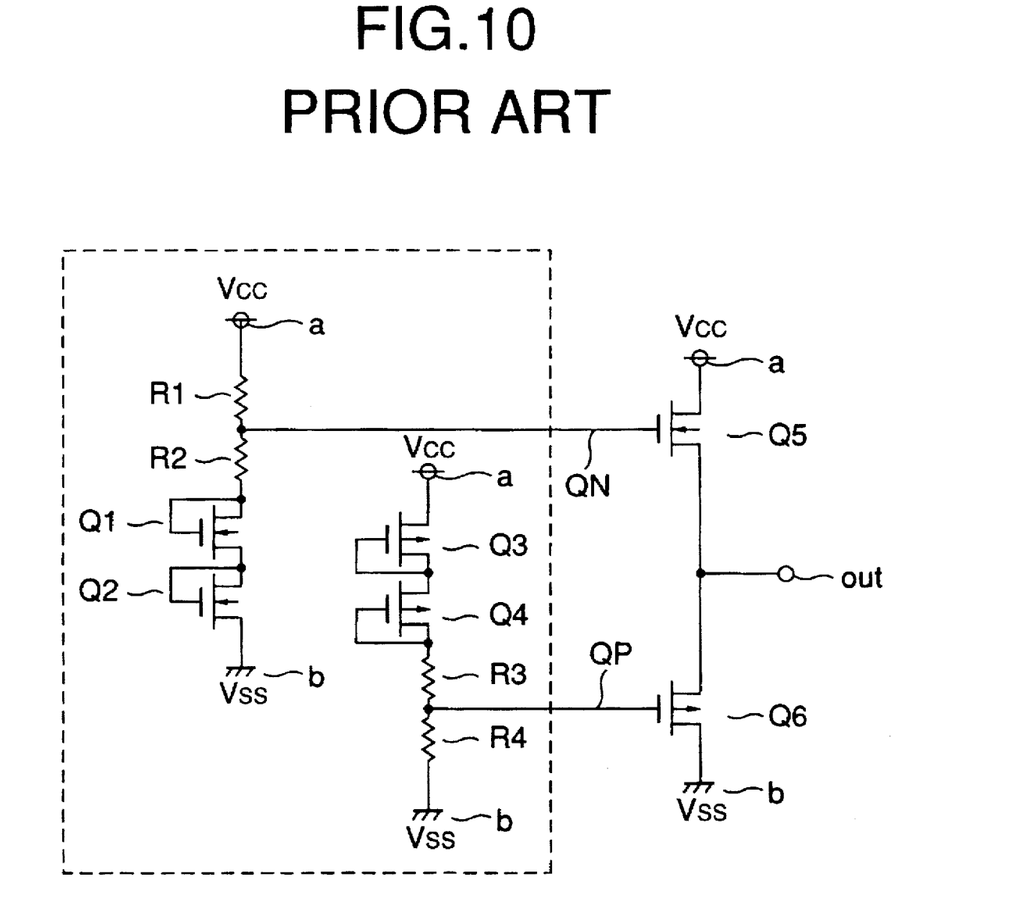
FIG. 10 is a circuit diagram showing an intermediate potential generation circuit according to the prior art.

FIG. 10 is a circuit diagram of a conventional intermediate potential generation circuit (hereinafter referred to as a ½ $V_{cc}$ generation circuit) described in U.S. Pat. No. 4,692,689, for example.

In FIG. 10, a power source potential node "a" is connected to a power source potential $V_{cc}$; an earth potential node "b" is connected to a ground potential $V_{ss}$; and an output node "out" is a terminal for generating an intermediate potential ½ $V_{cc}$. Resisters R1,R2 of equal values of resistance, and N channel MOS transistors Q1,Q2, are connected in series between nodes "a" and "b". Further, P channel MOS transistors Q3,Q4 and resisters R3,R4 of equal resistance values, are connected in series between nodes "a" and "b". N channel MOS transistor Q5 and P channel MOS transistor Q6 are connected between nodes "a" and "b", and form the output stage transistors to generate an intermediate potential to an output node "out".

As the threshold voltage of MOS transistors is $V_{th}$, and resisters R1,R2 have the same value of resistance, the potential of the first node QN will be ½ $V_{cc}$ +|$V_{th}$|. On the other hand, the potential of the second node QP will be ½ $V_{cc}$−|$V_{th}$|, because resisters R3,R4 have a same value of resistance each other. If the potential of the output node "out" fluctuates from time to time, either transistor Q5 or Q6 of the output stage transistors is turned on to maintain the potential of the output node to ½ $V_{cc}$.

The conventional intermediate potential generating circuit mentioned above, however, has a problem in that precise control of the output potential is difficult to achieve, because the threshold voltage |$V_{th}$| of the MOS transistors is usually 0.7V or so, and with a low voltage power source, the voltage drop of the MOS transistor represents a significant percentage of the source voltage. Moreover, the conventional intermediate potential generating circuit has a disadvantage in that a through current flows via the output stage transistors Q5 and Q6 because each source-gate voltage of the transistors Q5 and Q6 has the same value $V_{th}$, resulting in high power consumption.

DISCLOSURE OF THE INVENTION

The present invention is made to solve the above-discussed problems, and an object of the invention is to

2 provide an intermediate potential generation circuit of high precision capable of returning rapidly to a predetermined potential even if any noise is mixed into the generated potential.

Another object of the invention is to provide an intermediate potential generation circuit with no through current and, therefore, less power consumption.

Further object of the invention is to provide an intermediate potential generation circuit which is capable of preventing the output from oscillation about the intermediate potential.

According to a general aspect of the invention, an intermediate potential generation circuit comprises a constant voltage generation circuit including a voltage division circuit connected between a power source potential node and an earth potential node, and generating first and second potentials which are slightly different each other and from an intermediate potential. An N channel MOS transistor, connected between the power source potential node and an intermediate potential node, receives the potential corresponding to the first potential. A P channel MOS transistor, connected between the intermediate potential node and the earth potential node, receives the potential corresponding to the second potential. The back gate of either one of the two MOS transistors is connected to the gate thereof.

BRIEF DESCRIPTION OF DRAWINGS

In all figures, like elements are given the same numbers.

BEST MODE FOR CARRYING OUT THE INVENTION

Figure 1:
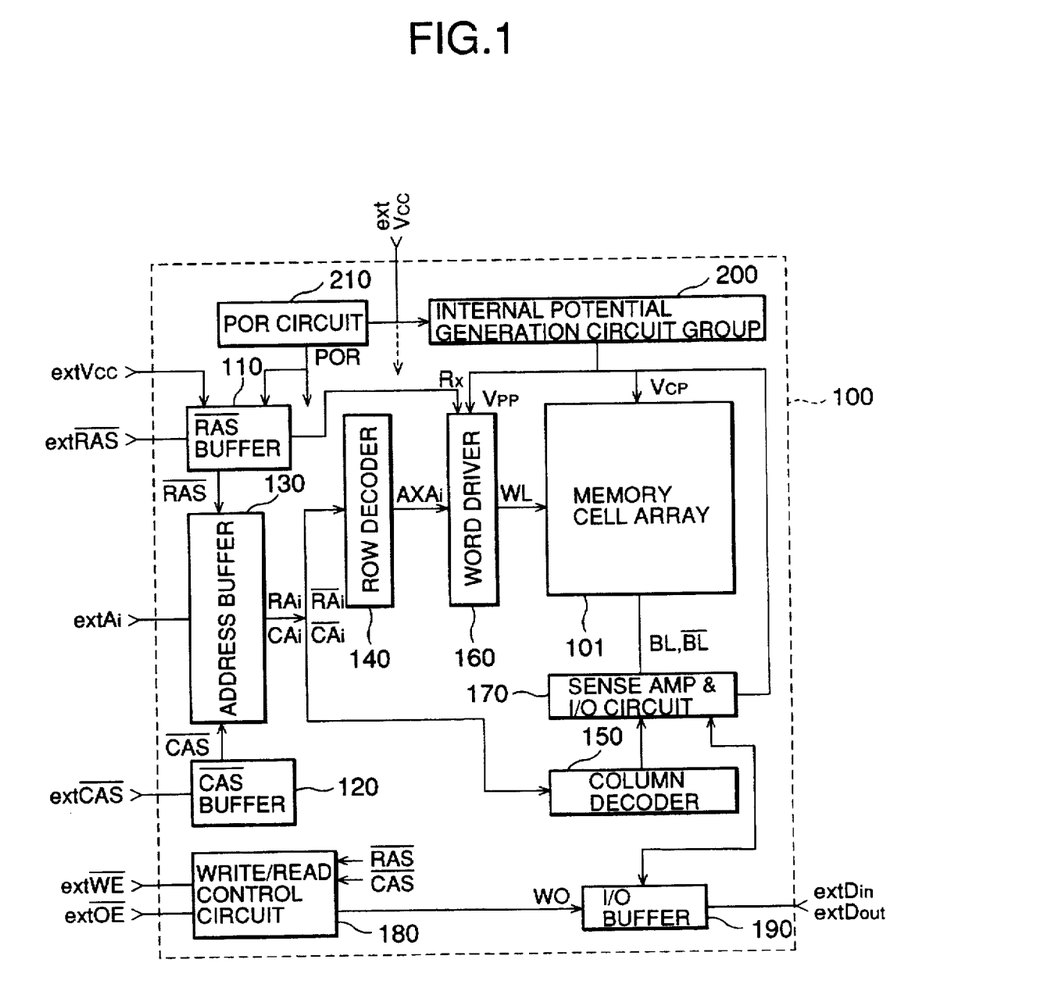
FIG. 1 is a block diagram of a DRAM in which the present invention is applied.

FIG. 1 shows a block diagram of the DRAM (Dynamic Random Access Memory) 100 in which the invention is applied, including an internal potential generation circuit group 200, a POR (Power On Reset) circuit 210 and a memory cell array 101 comprised of a plurality of memory cells arranged in a plurality of rows and columns. A/RAS (Row Address Strobe) buffer 110 receives an external /RAS signal applied from outside and outputs RAS signal to an address buffer 130; and a/CAS (Column Address Strobe) buffer 120 receives an external /CAS signal applied from outside and outputs a/CAS signal to the address buffer 130. The address buffer 130 receives an external address signal ext Ai (i=0, 1, 2, ..) and the/RAS signal, latches the external address signal ext Ai, and outputs row address signals RAi and/RAi for the internal circuit. Further, the address buffer 130 receives the external address signal ext Ai (i=0, 1, 2, , .) and the/CAS signal, latches the external address signal ext Ai, and outputs column address signals CAi and /CAi for the internal circuit.

A row decoder 140 receives the row address signals RAi and/RAi from the address buffer 130 and selects a corresponding word line; a column decoder 150 receives the CAi and/CAi signals from the address buffer 130 and selects a corresponding sense amplifier and I/O circuit 170 in which a potential of a memory cell 101 read out on a bit line is amplified, and data of the memory cell 101 read out on the bit line is transferred. Numeral 160 designates a word driver for boosting a potential of the word line selected by the row decoder 140; 180 designates a write and read control circuit which receives a write enable signal ext/WE and an output enable signal ext/OE applied from outside, and outputs a signal WO for controlling read and write of the internal circuit; and 190 designates an I/O buffer which receives the signal WO from the write and read control circuit 180, transfers data ext Din applied from outside to the sense amplifier and I/O circuit 170 through a data line in case of write, and outputs data read out from the memory cell through the sense amplifier and I/O circuit 170 and the data line to the I/O pin as data ext Dout in case of readout.

Figure 2:
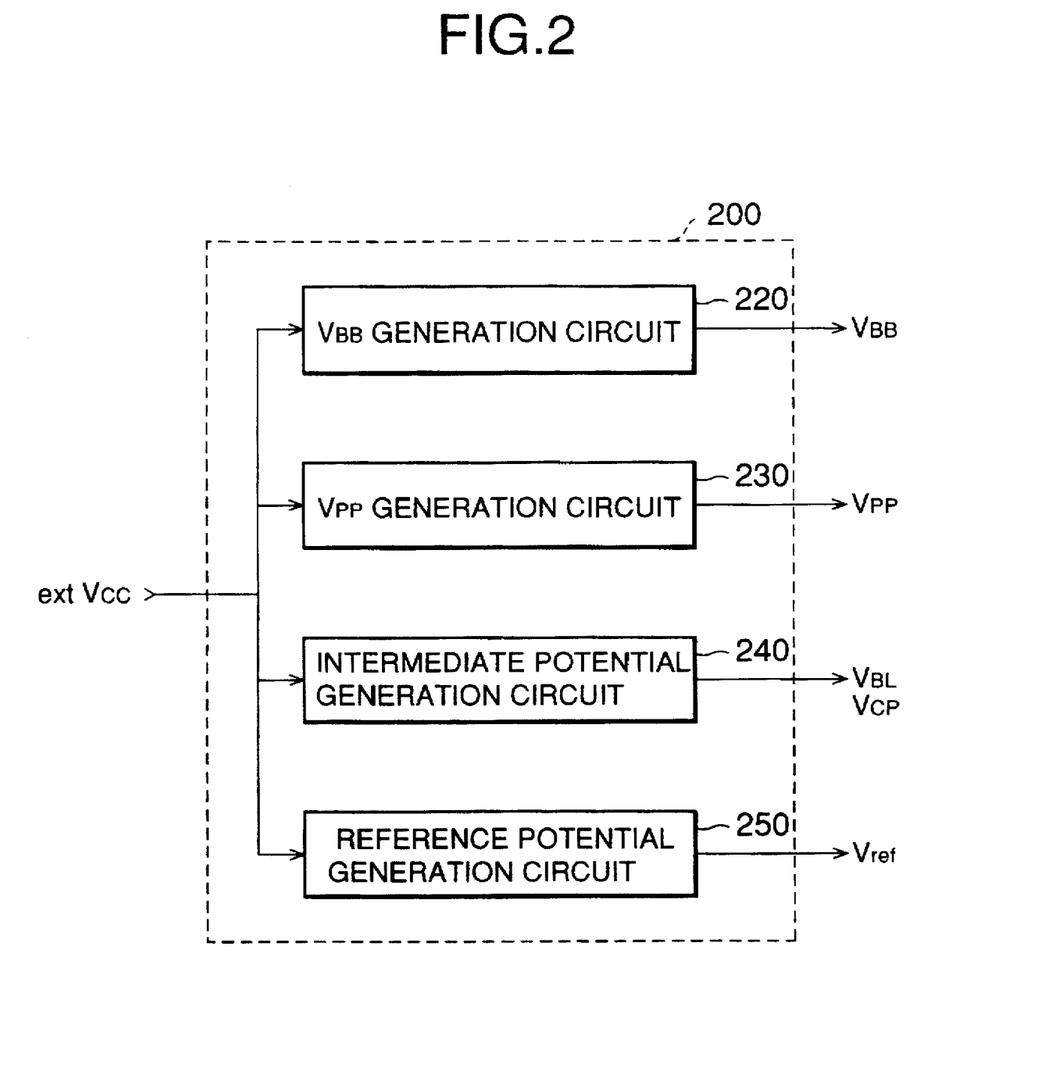
FIG. 2 is a block diagram showing an example of an internal potential generation circuit group shown in FIG. 1.

FIG. 2 is a block diagram of the internal potential generation circuit group 200 shown in FIG. 1, and comprises a $V_{BB}$ generation circuit 220 for generating a substrate potential $V_{BB}$ lower than the ground potential $V_{ss}$, a $V_{PP}$ generation circuit 230 for generating a boosting potential $V_{PP}$ higher than $V_{cc}$, an intermediate potential generation circuit 240 for generating an intermediate potential ½ $V_{cc}$ serving as a cell plate potential $V_{CP}$ and a bit line precharge potential $V_{BL}$, and a reference potential generation circuit 250 for generating a reference voltage $V_{ref}$.

Figure 4:
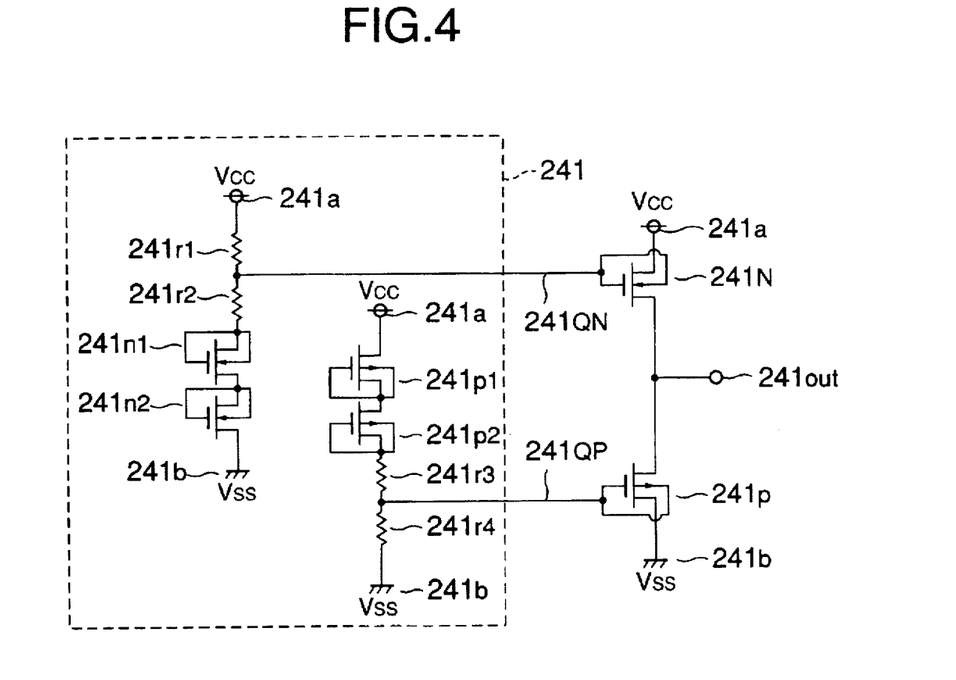
FIG. 4 is a circuit diagram showing an intermediate potential generation circuit according to the invention.

Then, the intermediate potential generation circuit 240 according to the invention shown in FIG. 2 is described with reference to FIGS. 4 to 9. In FIG. 4, reference numeral 241a designates a source potential node to which source potential $V_{cc}$ is applied; numeral 241b designates a ground potential node to which grounding potential $V_{ss}$ is applied; and numeral 241 designates a controlled potential generation circuit for generating two potentials as first and second output potentials corresponding to the threshold voltage of the transistors. Numeral 241out designates an intermediate potential output node; numeral 241N designates a N-channel MOS transistor which is connected between the source potential node 241a and the intermediate potential output node 241out, and in which its gate is connected to a first output node 241QN of the controlled potential generation circuit 241 and its back gate is connected to its gate. Numeral 241P designates a P-channel MOS transistor which is connected between the ground potential node 241b and the intermediate potential output node 241out, and in which its gate is connected to a second output node 241QP of the controlled potential generation circuit 241 and its back gate is connected to its gate. Then, an arrangement of the controlled potential generation circuit 241 shown in FIG. 4 is described hereinbelow. Reference numerals 241r1 and 241r2 designate resistance elements of the same resistance value, connected in series between the source potential node 241a and a transistor 241n1 which is described later. Numerals 241n1 and 241n2 designate N-channel MOS transistors of the same transistor dimensions each being diode-connected and in which its back gates are connected to its gate, the N-channel MOS transistors 241n1 and 241n2 being connected in series between the resistance element 241r2 and the ground potential node 241b so as to be disposed in forward direction from the resistance element 241r2 to the ground potential node 241b. Numerals 241r3 and 241r4 designate resistance elements of the same resistance value; and numerals 241p1 and 241p2 designate P-channel MOS transistors of the same transistor dimensions each being diode-connected and in which its back gate is connected to its a gate, the P-channel MOS transistors 241p1 and 241p2 being connected in series between the source potential node 241a and the resistance element 241r3 so as to be disposed in forward direction from the source potential node 241a to the resistance element 241r3.

Figure 3:
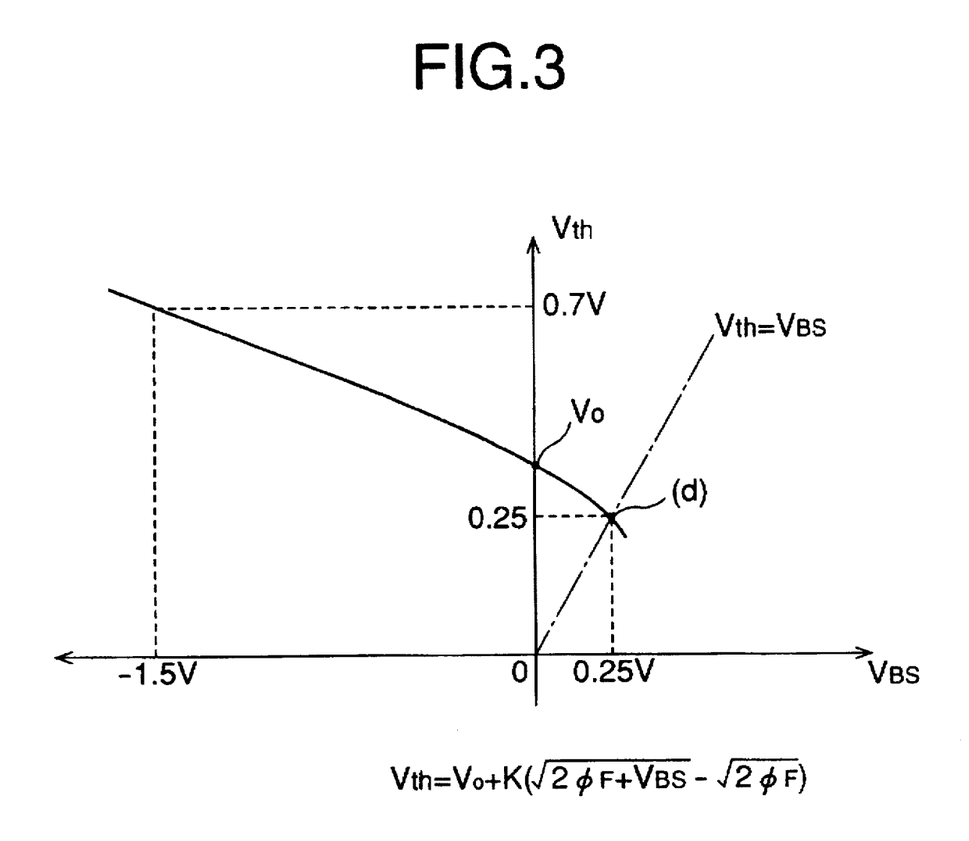
FIG. 3 is a graph showing a characteristic of threshold voltage of a MOS transistor with respect to voltage between back gate and source according to the invention.

The threshold voltage of a MOS transistor in which its back gate is connected to its gate is hereinafter described with reference to FIG. 3. FIG. 3 is a graph showing schematically fluctuation in the threshold voltage $V_{th}$ of the MOS transistor with respect to potential difference $V_{BS}$ between the back gate and source of the MOS transistor; the potential difference is shown in the following expression (1).

$$V_{th}=V_0+K[(2\phi_F+V_{BS})^{1/2}-(2\phi_F)^{1/2}] \quad (1)$$

where: $V_{BS}$ indicates back gate voltage (on the basis of source voltage), K indicates body effect constant, $\phi_F$ indicates surface potential, and $V_0$ indicates threshold voltage when $V_{BS}$=0V.

In the graph of FIG. 3, (d) indicates a point at which the potential difference VBS between the back gate and source of the MOS transistor is equal to the threshold voltage $V_{th}$ of the MOS transistor. As is explicit from FIG. 3, it becomes possible to reduce its threshold voltage from 0.7V in case of the conventional $V_{BS}$=−1.5V to 0.25V, which is smaller than the threshold voltage 0.35V of the MOS transistor in case of $V_{BS}$=0V by 0.1V, because $V_{BS}$ becomes equal to $V_{th}$. This $V_{BS}=V_{th}$ may be obtained by interconnecting the back gate and the gate in the MOS transistor. In the description given hereinafter, for the sake of distinction, $|V_{th0}|$ indicates an absolute value of the threshold voltage of the MOS transistor at the moment of connecting the back gate and the gate, while $|V_{th}|$ indicates the conventional threshold voltage of $V_{BS0}$=−1.5V.

Then, operation of the intermediate potential generation circuit arranged as above is hereinafter described. It is herein established that the absolute value of the threshold voltage of the N-channel MOS transistors 241n1 and 241n2 with their back gate and gate interconnected is $|V_{thn0}|$, and the absolute value of the threshold voltage of the P-channel MOS transistors with their back gate and gate interconnected is $|V_{thp0}|$. A potential of $½V_{cc}+|V_{thn0}|$ is generated in the first output node 241QN of the controlled potential generation circuit 241 due to resistive division of the resistance elements 241r1, 241r2 and the N-channel MOS transistors 241n1, 241n2. On the other hand, a potential of $½V_{cc}-|V_{thp0}|$ is generated in the second output node 241QP of the controlled potential generation circuit 241 due to resistive division of the resistance elements 241r3, 241r4 and the N-channel MOS transistors 241p1, 241p2.

Namely, the potential difference between the first output node 241QN and the second output node 241QP is adapted to be equal to the summation of the respective threshold voltages of both MOS transistors 241N and 241P, that is, $|V_{thn0}|+|V_{thp0}|$.

Focusing on the operation of the N-channel MOS transistor 241N, first of all, when the intermediate output node 241out is $\frac{1}{2}V_{cc}$, the voltage between the gate and source of the transistor 241N is $|V_{thn0}|$, and the voltage between the back gate and source thereof is $|V_{thn0}|$, whereby the absolute value of the threshold voltage of the transistor 241N is $|V_{thn0}|$, causing it to attain a state of a boundary between conductive and non-conductive states. If the potential of the intermediate potential output node 241out drops lower than $\frac{1}{2}V_{cc}$, the voltage between the gate and source becomes higher than $|V_{thn0}|$ and the voltage between the back gate and source becomes higher than $|V_{thn0}|$; consequently, a stronger conductive state is formed. As a result, an electric charge is supplied to the intermediate potential node 241out, and the potential of this intermediate potential output node 241out is raised.

With respect to the operation of the P-channel MOS transistor 241P, when the potential of the intermediate output node 241out is $\frac{1}{2}V_{cc}$, the voltage between the gate and source of the transistor 241P is $|V_{thp0}|$ and the voltage between the back gate and source thereof is $|V_{thp0}|$, whereby absolute value of the threshold voltage of the transistor 241P is $|V_{thp0}|$, causing it to attain a state of a boundary between conductive and non-conductive states.

Further, in the P-channel MOS transistor 241P, if potential of the intermediate potential output node 241out rises above $\frac{1}{2}V_{cc}$, the voltage between the gate and source rises $|V_{thp0}|$ and the voltage between the back gate and source rises above $|V_{thp0}|$; consequently, a stronger conductive state is formed. As a result, an electric charge is drawn out of the intermediate potential node 241out, and the potential of this intermediate potential output node 241out drops.

As described above, by supplying an electric charge from the source potential node 241a to the intermediate potential output node 241out or by drawing out the electric charge from the intermediate potential output node 241out to the ground potential node 241b, the potential of the intermediate potential output node 241out becomes $\frac{1}{2}V_{cc}$ automatically, and this potential remains unchanged.

Figure 5:
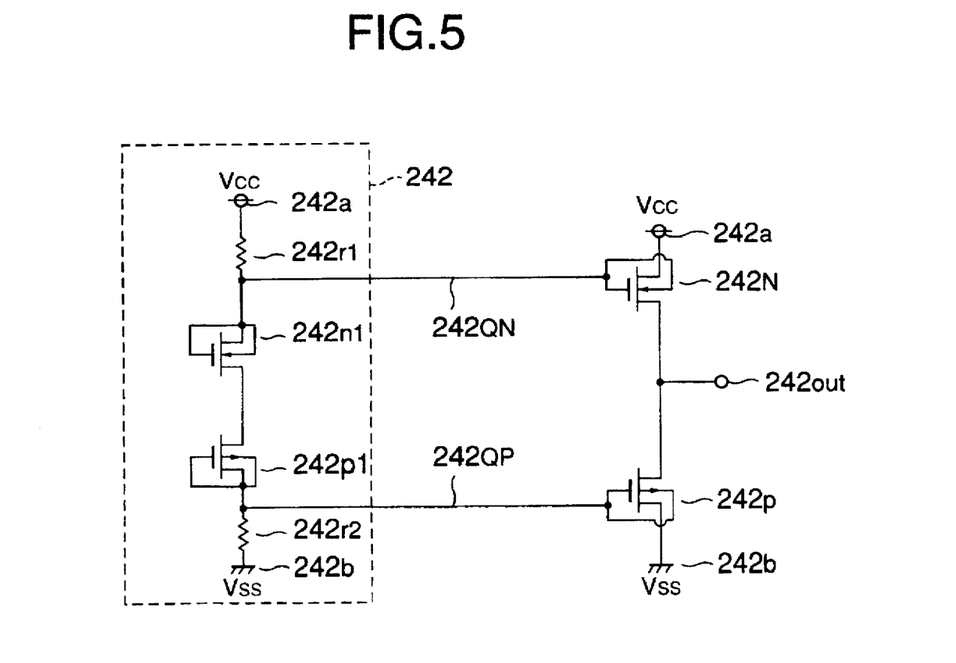
FIG. 5 is a circuit diagram showing another example of the intermediate potential generation circuit according to the invention.

FIG. 5 shows another intermediate potential generation circuit. In FIG. 5, reference numeral 242a designates a source potential node to which source potential $V_{cc}$ is applied; numeral 242b designates a ground potential node to which ground potential $V_{ss}$ is applied; and numeral 242 designates a controlled potential generation circuit for generating two potentials as first and second output potentials corresponding to the threshold voltage of the transistors. Numeral 242out designates an intermediate potential output node; numeral 242N designates an N-channel MOS transistor which is connected between the source potential node 242a and the intermediate potential output node 242out, and in which a gate is connected to a first output node 242QN of the controlled potential generation circuit 242 and in which its back gate is connected to its gate. Numeral 242P designates a P-channel MOS transistor which is connected between the ground potential node 242b and the intermediate potential output node 242out, and in which its gate is connected to a second output node 242QP of the controlled potential generation circuit 242 and in which its back gate is connected to its gate.

In the intermediate potential generation circuit shown in FIG. 5, there is a difference from the intermediate potential generation circuit shown in FIG. 4 in the aspect of arrangement of the controlled potential generation circuit 242, and therefore the arrangement of the controlled potential generation circuit 242 is hereinafter described. Reference numerals 242r1 and 242r2 designate resistance elements of the same resistance value, and the resistance element 242r1 is connected between the source potential node 242a and the first output node 242QN of the controlled potential generation circuit 242, while the resistance element 242r2 is connected between the ground potential node 242b and the second output node 241QN of the controlled potential generation circuit 242. Numerals 242n1 designates a diode-connected N-channel MOS transistor in which its back gate is connected to its gate; and numeral 242p1 designates a diode-connected P-channel MOS transistor in which its back gate is connected to its gate. The N-channel MOS transistor 242n1 and the P-channel MOS transistor 241p2 are connected in series between the first output node 242QN and the second output node 242QP so as to be disposed in forward direction from the first output node 242QN to the second output node 241QP.

Then, operation of the intermediate potential generation circuit of FIG. 5 arranged as above is hereinafter described. It is herein established that the absolute value of the threshold voltage of the N-channel MOS transistor is $|V_{thn0}|$, and the absolute value of the threshold voltage of the P-channel MOS transistor is $|V_{thp0}|$. A potential of $\frac{1}{2}V_{cc}+\frac{1}{2}(|V_{thp0}|+|V_{thn0}|)$ is generated in the first output node 242QN of the controlled potential generation circuit 242 due to resistive division of the resistance elements 242r1, 242r2 and the N-channel MOS transistor 242n1 and the P-channel MOS transistor 242p1. On the other hand, a potential of $\frac{1}{2}V_{cc}-\frac{1}{2}(|V_{thp0}|+|V_{thn0}|)$ is generated in the second output node 242QP due to resistive division.

Again, the potential difference between the first output node 242QN and the second output node 242QP is adapted to be equal to the summation of the respective threshold voltages of the both MOS transistors 242N and 242P, that is, $|V_{thn0}|+|V_{thp0}|$.

Now, focusing on the operation of the N channel MOS transistor 242N, first of all, when the potential of the intermediate output node 242out is $\frac{1}{2}V_{cc}+\frac{1}{2}(|V_{thp0}|-|V_{thn0}|)$, the voltage between the gate and source is $|V_{thn0}|$, and the voltage between the back gate and source is also $|V_{thn0}|$, whereby the absolute value of the threshold voltage is $|V_{thn0}|$, causing it to attain the state of a boundary between conductive and non-conductive states. If the potential of the intermediate potential output node 242out drops below $\frac{1}{2}V_{cc}+\frac{1}{2}(|V_{thn0}|-|V_{thn0}|)$, the voltage between the gate and source becomes higher than $|V_{thn0}|$ and the voltage between the back gate and source becomes higher than $|V_{thn0}|$; consequently, a stronger conductive state is formed. As a result, an electric charge is supplied to the intermediate potential node 242out, and the potential of this intermediate potential output node 242out is raised.

With respect to the operation of P-channel MOS transistor 242P, when the potential of the intermediate potential output node 242out is $\frac{1}{2}V_{cc}+\frac{1}{2}(|V_{thp0}|-|V_{thn0}|)$, the voltage between the gate and source is $|V_{thp0}|$ and the voltage between the back gate and source is $|V_{thp0}|$, whereby the absolute value of the threshold voltage is $|V_{thp0}|$, causing it to attain a state of a boundary between conductive and non-conductive states. Further, in the P-channel MOS transistor 242P, if the potential of the intermediate potential output node 242out rises above $\frac{1}{2}V_{cc}+\frac{1}{2}(|V_{thp0}|-|V_{thn0}|)$, the voltage between the gate and source drops below $-|V_{thn0}|$ and the voltage between the back gate and source rises above $|V_{thp0}|$; consequently, a stronger conductive state is formed. As a result, an electric charge is drawn out of the intermediate potential node 242out, and the potential of this intermediate potential output node 242out drops.

As described above, by supplying an electric charge from the source potential node 242a to the intermediate potential output node 242out or by drawing out the electric charge from the intermediate potential output node 242out to the ground potential node 242b, the potential of the intermediate potential output node 242out becomes ½$V_{cc}$+½ (|$V_{thpo}$|-|$V_{thno}$|). If |$V_{thpo}$|=|$V_{thno}$| is set beforehand, ½$V_{cc}$ is always outputted at the intermediate potential output node 242out, and this potential remains unchanged.

Figure 6:
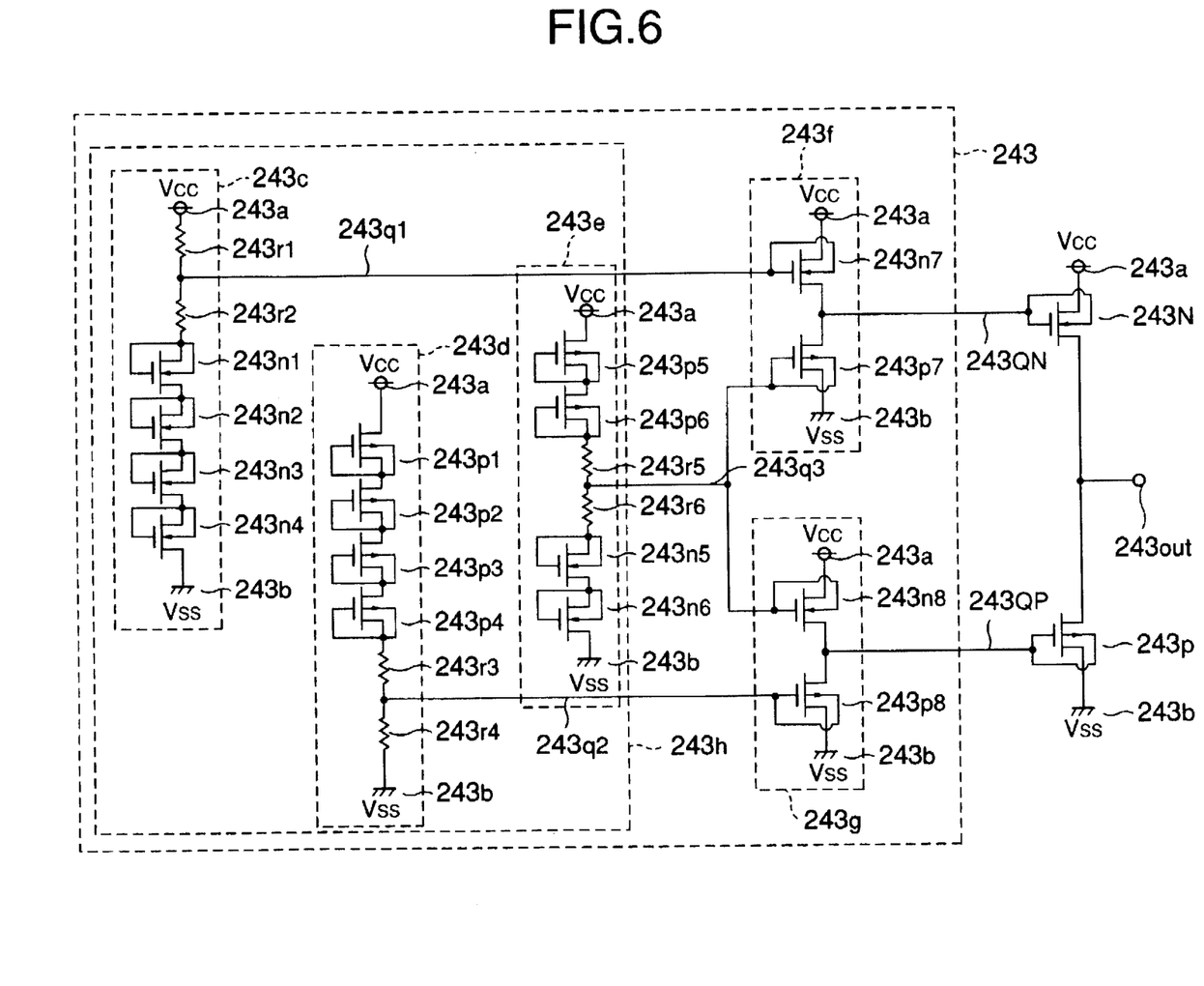
FIG. 6 is a circuit diagram showing a further example of the intermediate generation circuit according to the invention.

FIG. 6 shows another embodiment of a intermediate potential generation circuit according to the invention. In FIG. 6, reference numeral 243a designates a source potential node to which source potential $V_{cc}$ is applied; numeral 243b designates a ground potential node to which ground potential $V_{ss}$ is applied; and numerals 243 designate a controlled potential generation circuit for generating two potentials as first and second output potentials corresponding to the threshold voltage of the transistors. Numeral 243out designates an intermediate potential output node; and numeral 243N designates a N-channel MOS transistor which is connected between the source potential node 243a and the intermediate potential output node 243out, and in which its gate is connected to a first output node 243QN of the controlled potential generation circuit 243 and its back gate is connected to its gate. Numeral 243P designates a P-channel MOS transistor which is connected between the ground potential node 243b and the intermediate potential output node 243out, and in which its gate is connected to a second output node 243QP of the controlled potential generation circuit 243 and its back gate is connected to its gate.

In the intermediate potential generation circuit shown in FIG. 6, there is a difference from the intermediate potential generation circuit shown in FIG. 4 or FIG. 5 in the aspect of arrangement of the controlled potential generation circuit 243, and therefore the arrangement of the controlled potential generation circuit 243 is hereinafter described.

Resistance elements 243r1 and 243r2, each of which has the same resistance value, are connected in series from the source potential node 243a. A plurality of N-channel MOS transistors 243n1, 243n2, 243n3 and 243n4, each of which is diode-connected and in each of which its back gate is connected to its gate, are connected in series between the resistance element 243r2 and the ground potential node 243b so as to be disposed in forward direction from the resistance element 243r2 to the ground potential node 243b. In this manner, the resistance elements 243r1, 243r2 and N-channel MOS transistors 243n1, 243n2, 243n3 and 243n4 form a voltage division circuit 243c for generating a potential ½$V_{cc}$+2|$V_{thno}$| from the node 243q1.

In the second voltage division circuit 243d, a plurality of P-channel MOS transistors 243p1, 243p2, 243p3 and 243p4, each of which is diode-connected and in each of which its back gate is connected to its gate, are connected in series between the source potential node 243a and the resistance element 243r3 so as to be disposed in forward direction from the source potential node 243a to the resistance element 243r3. Resistance elements 243r3 and 243r4 of the same resistance value are connected in series from the MOS transistor 243p4 to the ground potential node 243b. The resistance elements 243r1, 243r2 and P-channel MOS transistors 243p1, 243p2, 243p3 and 243p4 form a voltage division circuit 243d for generating a potential ½$V_{cc}$-2|$V_{thpo}$| from the node 243q2.

Reference numerals 243r5 and 243r6 designate resistance elements of the same resistance value; and numerals 243p5 and 243p6 respectively designate diode-connected P-channel MOS transistors in each of which its back gate is connected to its gate, and which are connected in series between the source potential node 243a and the resistance element 243r5 so as to be disposed in forward direction from the source potential node 243a to the resistance element 243r5. Numerals 243n5 and 243n6 respectively designate diode-connected N-channel MOS transistors in each of which its back gate is connected to its gate, and which are connected in series between the resistance element 243r6 and the ground potential node 243b so as to be disposed in a forward direction from the resistance element 243r6 to the ground potential node 243b. These P-channel MOS transistors 243p5, 243p6, resistance elements 243r5, 243r6, and N-channel MOS transistors 243n5, 243n6 form a voltage division circuit 243e for generating a potential ½$V_{cc}$+ (|$V_{thno}$|-|$V_{thpo}$|) from the connection node 243q3 between the resistance elements 243r5 and 243r6.

Reference numeral 243n7 designates an N-channel MOS transistor which is connected between the source potential node 243a and a first output node 243QN of the controlled potential circuit 243, and in which its gate is connected to the node 243q1 where the potential ½$V_{cc}$+2|$V_{thno}$| appears and its back gate is connected to its gate. Numeral 243p7 designates a P-channel MOS transistor which is connected between the ground potential node 243b and the first output node 243QN of the controlled potential circuit 243, and in which its gate is connected to the node 243q3 where the potential ½$V_{cc}$+(|$V_{thno}$|-|$V_{thpo}$|) appears and its back gate is connected to its gate. These N-channel MOS transistor 243n7 and the P-channel MOS transistor 243p7 form a potential generation circuit 243f for outputting a potential ½$V_{cc}$+2|$V_{thno}$| to the node 243QN.

Furthermore, reference numeral 243n8 designates a N-channel MOS transistor which is connected between the source potential node 243a and the second output node 243QP of the controlled potential circuit 243, and in which its gate is connected to the node 243q3 where the potential ½$V_{cc}$+(|$V_{thno}$|-|$V_{thno}$|) appears and its back gate is connected to its gate, and numeral 243p8 designates a P-channel MOS transistor which is connected between the ground potential node 243b and the second output node 243QP of the controlled potential circuit 243, and in which its gate is connected to the node 243q2 where the potential ½$V_{cc}$- 2|$V_{thno}$| appears and its back gate is connected to its gate. These N-channel MOS transistor 243n8 and the P-channel MOS transistor 243p8 form a potential generation circuit 243g for outputting a potential ½$V_{cc}$-|$V_{thpo}$| to the node 243QP. And the voltage division circuits 243c, 243d and 243e forms a potential generation circuit 243h for outputting three potentials ½$V_{cc}$+2|$V_{thno}$|, ½$V_{cc}$+(|$V_{thno}$|-|$V_{thpo}$|), and ½$V_{cc}$-2|$V_{thpo}$| to the nodes 243q1, 243q3 and 243q2, respectively.

Namely, the potential difference between the first output node 243QN and the second output node 243QP is adapted to be equal to the summation of the respective threshold voltages of both MOS transistors 243N and 243P, that is, |$V_{thno}$|+|$V_{thpo}$|.

Then, operation of the intermediate potential generation circuit of FIG. 6 arranged as above is hereinafter described. Since the N-channel MOS transistor 243n7 in the potential generation circuit 243f receives the potential ½$V_{cc}$+2|$V_{thno}$| from the voltage division circuit 243c at the gate, when the potential of the first output node 243QN of the controlled voltage generation circuit 243 is ½$V_{cc}$+|$V_{thno}$|, the voltage between the gate and source is |$V_{thno}$|, and the voltage between the back gate and source is |$V_{thno}$|, whereby the absolute value of the threshold voltage is |$V_{thno}$|, which is a boundary between conductive and non-conductive states. Further, when potential of the first output node 243QN is lower than ½$V_{cc}$+|$V_{thno}$|, the voltage between the gate and source in the N-channel MOS transistor 243n7 becomes higher than $|V_{thn0}|$ and the voltage between the back gate and source becomes also higher than $|V_{thn0}|$; consequently, a stronger conductive state is formed.

With respect to the P-channel MOS transistor 243p7, when the first output node 243QN of the controlled voltage generation circuit 243 is $\frac{1}{2}V_{cc}+|V_{thn0}|$, the voltage between the gate and source is $|V_{thp0}|$ and the voltage between the back gate and source is $|V_{thn0}|$, whereby the absolute value of the threshold voltage is $|V_{thp0}|$ which is a boundary between conductive and non-conductive states. Further, on the other hand, when potential of the first output node 243QN is higher than $\frac{1}{2}V_{cc}+|V_{thn0}|$, the voltage between the gate and source rises higher than $|V_{thp0}|$, and the voltage between the back gate and source raises higher than $|V_{thp0}|$; consequently, a stronger conductive state is formed.

As described above, by supplying an electric charge to the first output node 243QN of the controlled voltage generation circuit 243 by the N-channel MOS transistor 243n7 and P-channel MOS transistor 243p7 in the potential generation circuit 243f, or by drawing the electric charge from the first output node 243QN of the controlled voltage generation circuit 243, the potential of the first output node 243QN of the controlled voltage generation circuit 243 becomes $\frac{1}{2}V_{cc}+|V_{thn0}|$.

Since the N-channel MOS transistor 243n8 in the potential generation circuit 243g receives the potential $\frac{1}{2}V_{cc}+(|V_{thn0}|-V_{thp0}|)$ from the voltage division circuit 243e, when the potential of the second output node 243QP of the controlled voltage generation circuit 243 is $\frac{1}{2}V_{cc}-|V_{thp0}|$, the voltage between the gate and source is $|V_{thn0}|$, and the voltage between the back gate and source is $|V_{thn0}|$, whereby the absolute value of the threshold voltage is $|V_{thn0}|$, which is a boundary between conductive and non-conductive states. Further, when the potential of the second output node 243QP is lower than $\frac{1}{2}V_{cc}-|V_{thp0}|$, the voltage between the gate and source of the N-channel MOS transistor 243n8 becomes higher than $|V_{thn0}|$ and, moreover, the voltage between the back gate and source becomes also higher than $|V_{thn0}|$, whereby a stronger conductive state is formed.

With respect to P-channel MOS transistor 243p8, since the P-channel MOS transistor 243p8 in the potential generation circuit 243g receives the potential $\frac{1}{2}V_{cc}-2|V_{thp0}|$ from the voltage division circuit 243d, when the second output node 243QP of the controlled voltage generation circuit 243 is $\frac{1}{2}V_{cc}-|V_{thp0}|$, the voltage between the gate and source is $|V_{thp0}|$, and the voltage between the back gate and source is $|V_{thp0}|$, whereby the absolute value of the threshold voltage is $|V_{thp0}|$ which is a boundary between conductive and non-conductive states. In the P-channel MOS transistor 243p8 when potential of the second output node 243QP is higher than $\frac{1}{2}V_{cc}-|V_{thp0}|$, the voltage between the gate and source raises higher than $|V_{thp0}|$ and, moreover, the voltage between the back gate and source raises higher than $|V_{thp0}|$, whereby a stronger conductive state is formed.

In this manner, by supplying an electric charge to the second output node 243QP of the controlled voltage generation circuit 243 by the N-channel MOS transistor 243n8 and P-channel MOS transistor 243p8 in the potential generation circuit 243g, or by drawing the electric charge from the second output node 243QP of the controlled voltage generation circuit 243, the potential of the second output node 243QP of the controlled voltage generation circuit 243 becomes $\frac{1}{2}V_{cc}-|V_{thp0}|$.

When the intermediate potential output node 243out is below than $\frac{1}{2}V_{cc}$, the N-channel MOS transistor 243N whose gate is connected to the first output node 242QN of the controlled potential generation circuit 243 operates to raise the potential of the intermediate potential output node 243out by supplying an electric charge from the source potential node 243ato the intermediate potential output node 243out. On the other hand, when the intermediate potential output node 243out is above $\frac{1}{2}V_{cc}$, the P-channel MOS transistor 243P whose gate is connected to the second output node 242QP of the controlled potential generation circuit 243 operates to drop or lower the potential of the intermediate potential output node 243out by drawing the electric charge from the intermediate potential output node 243out to the ground potential node 243b. In this manner, by supplying an electric charge to the intermediate potential output node 243out or by drawing the electric charge from the intermediate potential output node 243out, the intermediate potential $\frac{1}{2}V_{cc}$ is generated and maintained.

Figure 7:
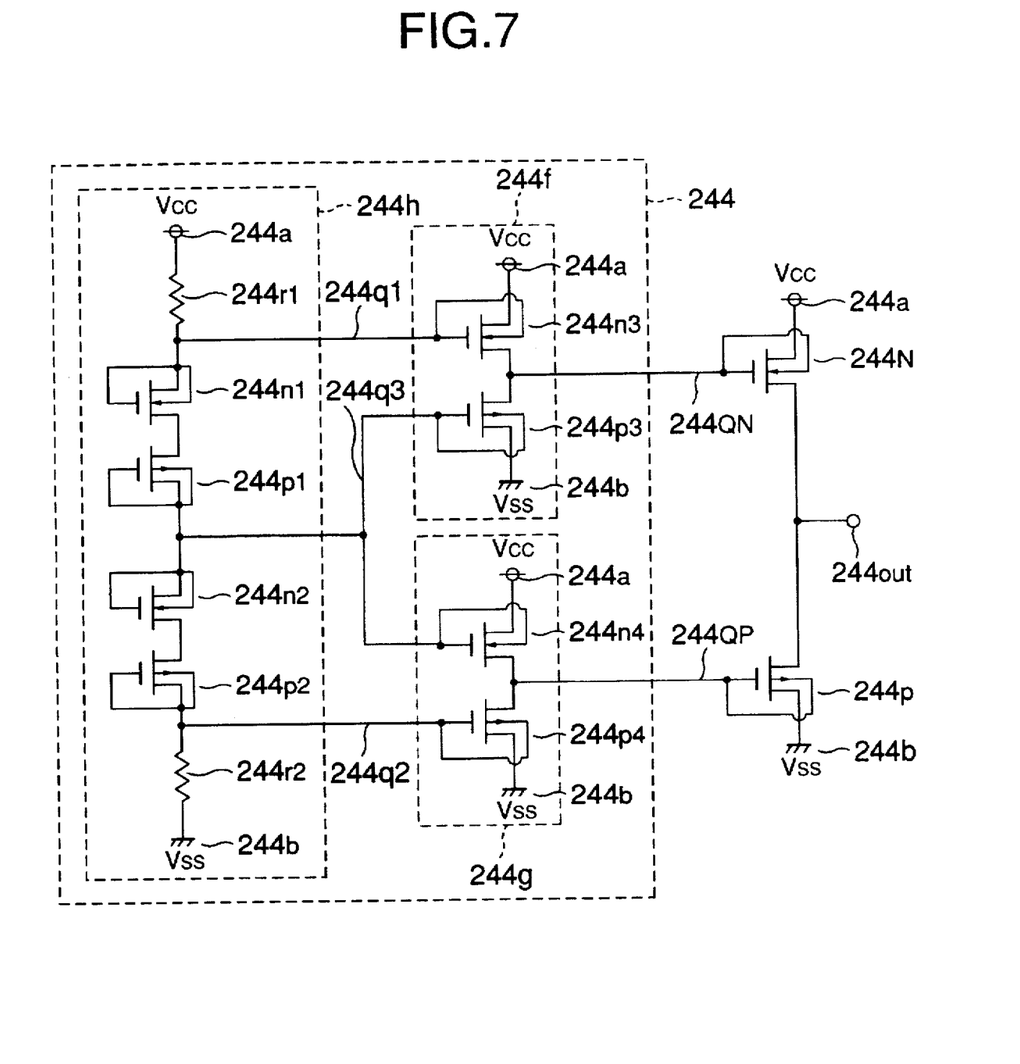
FIG. 7 is a circuit diagram showing a still further example of the intermediate potential generation circuit according to the invention.

FIG. 7 shows a further embodiment of intermediate potential generation circuit. In FIG. 7, reference numeral 244a designates a source potential node to which source potential $V_{cc}$ is applied; numeral 244b designates a ground potential node to which ground potential $V_{ss}$ is applied; and numerals 244 designate a controlled potential generation circuit for generating two potentials as first and second output potentials corresponding to the threshold voltage of the transistors. Numeral 244out designates an intermediate potential output node, and numeral 244N designates a N-channel MOS transistor which is connected between the source potential node 244a and the intermediate potential output node 244out, and in which its gate is connected to a first output node 244QN and its back gate is connected to its gate. Numeral 244P designates a P-channel MOS transistor which is connected between the ground potential node 244b and the intermediate potential output node 244out, and in which its gate is connected to a second output node 244QP and its back gate is connected to its gate.

In the intermediate potential generation circuit shown in FIG. 7, there is a difference from the intermediate potential generation circuit shown in FIG. 4 to FIG. 6 in the aspect of arrangement of the controlled potential generation circuit 244, and therefore the arrangement of the controlled potential generation circuit 244 is hereinafter described. Reference numerals 244r1 and 244r2 designate resistance elements of the same resistance value; numerals 244n1 and 243n2 respectively designate diode-connected N-channel MOS transistors in each of which its back gate is connected to its gate; and numerals 244p1 and 243p2 respectively designate diode-connected P-channel MOS transistors in each of which its back gate is connected to its gate. The N-channel MOS transistor 244n1 and the P-channel MOS transistor 244p1 are connected in series between the node 244q1 and the node 244q3 so as to be disposed in the forward direction from the node 244q1 to the node 244q3, and the N-channel MOS transistor 244n2 and the P-channel MOS transistor 244p2 are connected in series between the node 244q3 and the node 244q2 so as to be disposed in the forward direction from the node 244q3 to the node 244q3, forming a potential generation circuit 244h for outputting three potentials $\frac{1}{2}V_{cc}+|V_{thn0}|+|V_{thp0}|$, $\frac{1}{2}V_{cc}$, and $\frac{1}{2}V_{cc}-|V_{thn0}|-|V_{thp0}|$ to the respective nodes 244q1, 244q3 and 244q2.

Numeral 244n3 designates a N-channel MOS transistor which is connected between the source potential node 244a and the first output node 244QN of the controlled voltage generation circuit 244, and in which its gate is connected to the node 244q1 and its back gate is connected to its gate. Numeral 244p3 designates a P-channel MOS transistor which is connected between the ground potential node 244b and the first output node 244QN of the controlled voltage generation circuit 244, and in which its gate is connected to the node 244q3 and its back gate is connected to its gate. The N-channel MOS transistor 244n3 and the P-channel MOS transistor 244p3 form a potential generation circuit 244f. Numeral 244n4 designates a N-channel MOS transistor which is connected between the source potential node 244a and the second output node 244QP of the controlled voltage generation circuit 244, and in which its gate is connected to the node 244q3 and its back gate is connected to its gate. Numeral 244p4 designates a P-channel MOS transistor which is connected between the ground potential node 244b and the second output node 244QP of the controlled voltage generation circuit 244, and in which its gate is connected to the node 244q2 and its back gate is connected to its gate. The N-channel MOS transistor 244n4 and the P-channel MOS transistor 244p4 form a potential generation circuit 244g.

Then, operation of the intermediate potential generation circuit of FIG. 7 arranged as above is hereinafter described. It is herein established that the absolute value of the threshold voltage of the N-channel MOS transistor is $|V_{thn0}|$, and the absolute value of the threshold voltage of the P-channel MOS transistor is $|V_{thp0}|$. Since the N-channel MOS transistor 244n3 in the potential generation 244f receives the potential $\frac{1}{2}V_{cc}+|V_{thn0}|+|V_{thp0}|$ from the potential generation circuit 244h at the gate, when the potential of the first output node 244QN of the controlled voltage generation circuit 244 is $\frac{1}{2}V_{cc}+|V_{thp0}|$, the voltage between the gate and source is $|V_{thn0}|$, and the voltage between the back gate and source is $|V_{thn0}|$. The absolute value of the threshold voltage of this N-channel MOS transistor 244n3 is $|V_{thn0}|$, which is a boundary between conductive and non-conductive states. If the potential of the first output node 244QN becomes lower than $\frac{1}{2}V_{cc}+|V_{thp0}|$, the voltage between the gate and source of the N-channel MOS transistor 244n3 becomes higher than $|V_{thn0}|$ and the voltage between the back gate and source becomes also higher than $|V_{thn0}|$, whereby a stronger conductive state is formed.

With respect to the P-channel MOS transistor 244p3, since the P-channel MOS transistor receives the potential $\frac{1}{2}V_{cc}$ from the potential generation circuit 244h, when the first output node 244QN of the controlled voltage generation circuit 244 is $\frac{1}{2}V_{cc}+|V_{thp0}|$, the voltage between the gate and source is $|V_{thp0}|$, and the voltage between the back gate and source is $|V_{thp0}|$. The absolute value of the threshold voltage of this P-channel transistor 244p3 is $|V_{thp0}|$ which is a boundary between conductive and non-conductive states.

Now, if the potential of the first output node 244QN of the controlled voltage generation circuit 244 becomes higher than $\frac{1}{2}V_{cc}+|V_{thp0}|$, the voltage between the gate and source of the transistor 244p3 raises higher than $|V_{thp0}|$ and, moreover, the voltage between the back gate and source also rises above $|V_{thp0}|$, while the absolute value of the threshold voltage of the P-channel MOS transistor 244p3 is smaller than $|V_{thp0}|$, whereby a conductive state is formed.

In this manner, by supplying an electric charge to the first output node 244QN of the controlled voltage generation circuit 244 through the N-channel MOS transistor 244n3 and P-channel MOS transistor 244p3 in the potential generation circuit 244f, or by drawing the electric charge from the first output node 244QN of the controlled voltage generation circuit 244, the potential of the first output node 244QN of the controlled voltage generation circuit 244 becomes $\frac{1}{2}V_{cc}+|V_{thp0}|$.

Further, since the N-channel MOS transistor 244n4 in the potential generation circuit 244g receives the potential $\frac{1}{2}V_{cc}$ from the potential generation circuit 244h at the gate, when the potential of the second output node 244QP is $\frac{1}{2}V_{cc}-|V_{thn0}|$, the voltage between the gate and source is $|V_{thn0}|$, and the voltage between the back gate and source is $|V_{thn0}|$. The absolute value of the threshold voltage of this N-channel MOS transistor 244n4 is $|V_{thn0}|$, which is a boundary between conductive and non-conductive states. If the potential of the second output node 244QP becomes lower than $\frac{1}{2}V_{cc}-|V_{thn0}|$, the voltage between the gate and source in the N-channel MOS transistor 244n4 becomes higher than $|V_{thn0}|$ and the voltage between the back gate and source becomes also higher than $|V_{thn0}|$, whereby a stronger conductive state is formed.

Further, since the P-channel MOS transistor 244p4 in the potential generation circuit 244g receives the potential $\frac{1}{2}V_{cc}-|V_{thn0}|-|V_{thp0}|$ from the potential generation circuit 244h, when the second output node 244QP of the controlled voltage generation circuit 244 is $\frac{1}{2}V_{cc}-|V_{thn0}|$, the voltage between the gate and source is $|V_{thp0}|$, and the voltage between the back gate and source is $|V_{thp0}|$. The absolute value of the threshold voltage of this P-channel transistor 244p4 is $|V_{thp0}|$ which is a boundary between conductive and non-conductive states. If the potential of the second output node 244QP becomes higher than $\frac{1}{2}V_{cc}-|V_{thn0}|$, the voltage between the gate and source raises above $|V_{thp0}|$ and the voltage between the back gate and source also rises above $|V_{thp0}|$, while the absolute value of the threshold voltage of the P-channel MOS transistor 244p4 remains smaller than $|V_{thp0}|$, whereby a stronger conductive state is formed.

In this manner, by supplying an electric charge to the second output node 244QP of the controlled voltage generation circuit 244 through the N-channel MOS transistor 244n4 and P-channel MOS transistor 244p4 in the potential generation circuit 244g, or by drawing the electric charge from the second output node 244QP of the controlled voltage generation circuit 244, the potential of the second output node 244QP of the controlled voltage generation circuit 244 becomes $\frac{1}{2}V_{cc}-|V_{thn0}|$ and remains unchanged.

When the intermediate potential output node 244out is below $\frac{1}{2}V_{cc}-|V_{thp0}|-|V_{thn0}|$, the N-channel MOS transistor 244N where gate is connected to the first output node 242QN of the controlled potential generation circuit 244 operates to raise the potential of the intermediate potential output node 244out by supplying an electric charge from the source potential node 244a to the intermediate potential output node 244out. On the other hand, when the intermediate potential output node 244out is higher than $\frac{1}{2}V_{cc}+|V_{thp0}|-|V_{thn0}|$, the P-channel MOS transistor 244P whose gate is connected to the second output node 244QP of the controlled potential generation circuit 244 operates to drop or lower the potential of the intermediate potential output node 244out by drawing the electric charge from the intermediate potential output node 244out to the ground potential node 244b.

In this manner, by supplying an electric charge to the intermediate potential output node 244out or by drawing the electric charge from the intermediate potential output node 244out, the intermediate potential $\frac{1}{2}V_{cc}$ is generated and remains unchanged.

Figure 8:
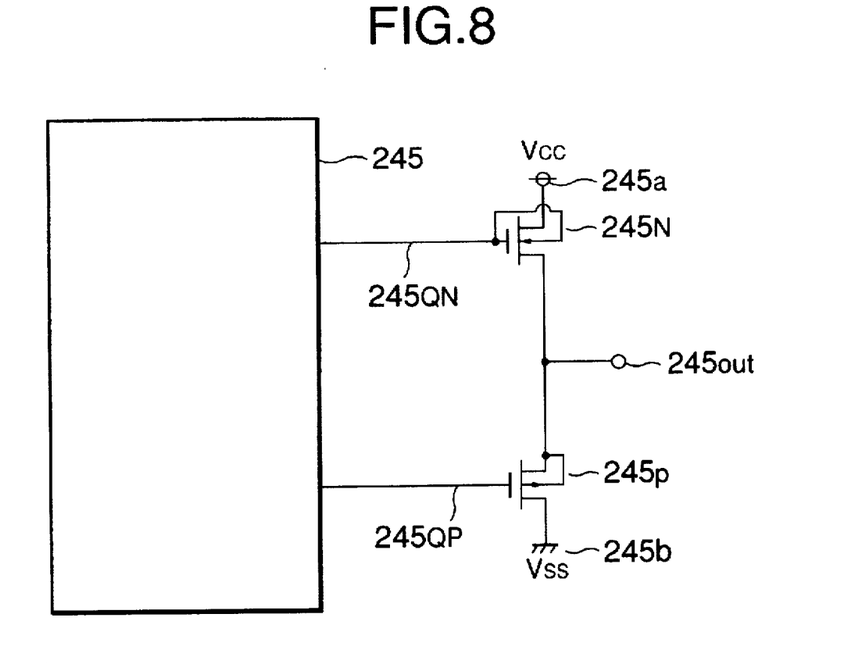
FIG. 8 is a circuit diagram showing yet a further example of the intermediate generation circuit according to the invention.

In the intermediate potential generation circuit of above arrangement, since the threshold voltages $|V_{thn0}|$ and $|V_{thp0}|$ of respective MOS transistors are small, it becomes possible to make a precise control of voltage. Further, another embodiment of intermediate potential generation circuit of the invention is described with reference to FIG. 8. In FIG. 8, a controlled voltage generation circuit 245 is shown in a block diagram since it is the same arrangement as the controlled voltage generation circuits of the intermediate potential generation circuits shown in FIG. 4 to FIG. 7. An N-channel MOS transistor 245N which is connected between a source potential node 245a and an intermediate potential output node 245out, and in which its gate is connected to a reference potential node 245QN and its back gate is connected to its gate, the controlled potential generation circuit 245 outputs any of three reference potentials $V_{ref1}$, that is $\frac{1}{2}V_{cc}+|V_{thn0}|$, $\frac{1}{2}V_{cc}+\frac{1}{2}(|V_{thp0}|+|V_{thn0}|)$ or $\frac{1}{2}V_{cc}+|V_{thp0}|$ to the reference potential node 245QN. A P-channel MOS transistor 245p which is connected between the intermediate potential output node 245out and a ground potential node 245b, and in which its gate is connected to a reference potential node 245QP and its back gate is connected to the intermediate potential output node 245out, the controlled potential generation circuit 245 outputs any of three reference potentials $V_{ref2}$, that is, $\frac{1}{2}V_{cc}-|V_{thp0}|$, $\frac{1}{2}V_{cc}-\frac{1}{2}(|V_{thp0}|+|V_{thn0}|)$ or $\frac{1}{2}V_{cc}-|V_{thn0}|$.

This intermediate potential generation circuit is different from those shown in FIG. 4 to FIG. 7 in the aspect that the back gate of the P-channel MOS transistor 245P is connected not to the gate but to the intermediate potential output node 245out. Accordingly, the absolute value of the threshold voltage of the P-channel MOS transistor 245P is $|V_{thp}|$ which is larger than $|V_{thp0}|$.

Then, operation of the intermediate potential generation circuit is hereinafter described. When the potential of the intermediate potential output node 245out is higher than $V_{ref2}+|V_{thp}|$, as the potential between the gate and source of the P-channel MOS transistor 245P is lower than $|V_{thp}|$, the P-channel MOS transistor 245P is in a conductive state, whereby electric charge is drawn from the intermediate potential output node 245out, and the potential of the intermediate potential output node 245out drops.

In this manner, the potential of the intermediate potential output node 245out attains an intermediate level $V_{ref1}-|V_{thn0}|$ and $V_{ref2}+|V_{thp}|$. More specifically, when the controlled potential generation circuit 245 is arranged as shown in FIG. 4 or FIG. 5, the potential attains an intermediate level between $\frac{1}{2}V_{cc}+|V_{thn0}|-|V_{thn0}|$ and $\frac{1}{2}V_{cc}-|V_{thp0}|+|V_{thp}|$; when arranged as shown in FIG. 6, the potential attains an intermediate level between $\frac{1}{2}V_{cc}+\frac{1}{2}(|V_{thp0}|+|V_{thn0}|)-|V_{thn0}|$ and $\frac{1}{2}V_{cc}-\frac{1}{2}(|V_{thp0}|+|V_{thn0}|)+|V_{thp}|$; and when arranged as shown in FIG. 7, the potential attains an intermediate level between $\frac{1}{2}V_{cc}+|V_{thp0}|-|V_{thn0}|$ and $\frac{1}{2}V_{cc}-|V_{thn0}|+|V_{thp}|$.

When the potential of the intermediate potential output node 245out is, as described above, an intermediate potential between $V_{ref1}-|V_{thn0}|$ and $V_{ref2}+|V_{thp}|$, since the N-channel MOS transistor 245N is always in a conductive state while the P-channel MOS transistor 245P is in a non-conductive state, a through current flowing from the source potential node 245a to the ground potential node 245b through the N-channel MOS transistor 245N, intermediate potential output node 245out and P-channel MOS transistor 245P may be restrained, making it possible to obtain an intermediate potential generation circuit of small power consumption.

Furthermore, when the potential of the intermediate potential output node 245out is an intermediate potential between $V_{ref1}-|V_{thn0}|$ and $V_{ref2}+|V_{thp}|$, since the N-channel MOS transistor 245N and the P-channel MOS transistor 245P are both in a non-conductive state, it may be possible to prevent the output from oscillation about the intermediate potential.

Figure 9:
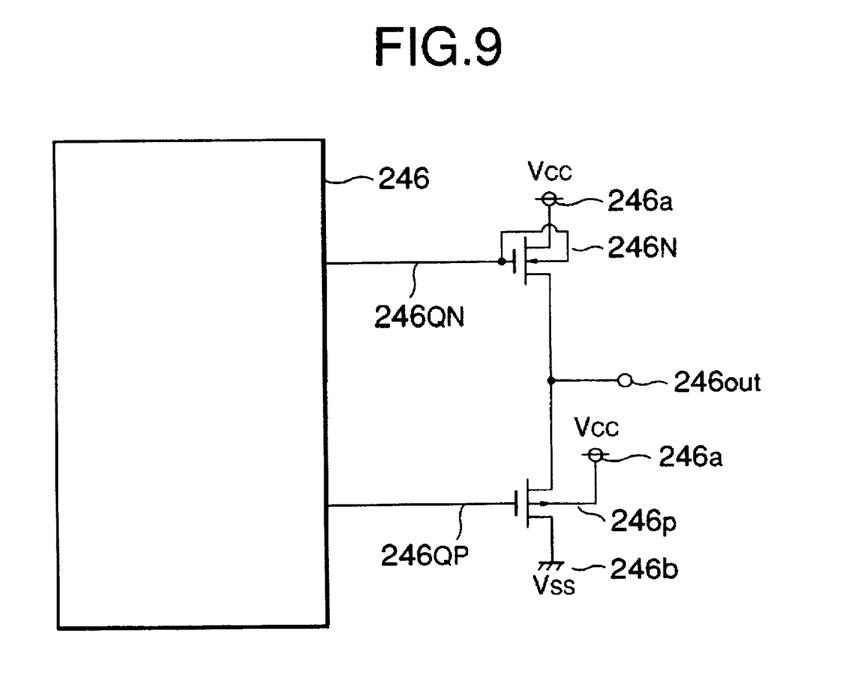
FIG. 9 is a circuit diagram showing a further example of the intermediate potential generation circuit according to the invention.

FIG. 9 shows another embodiment of intermediate potential generation circuit according to the invention. In FIG. 9, a controlled voltage generation circuit 246 is the same arrangement as those of the intermediate potential generation circuits shown in FIG. 4 to FIG. 6. An N-channel MOS transistor 246N which is connected between a source potential node 246a and an intermediate potential output node 246out, and in which its gate is connected to a reference potential node 246QN and its back gate is connected to its gate, the controlled potential generation circuit 246 outputs any of the three reference potentials $V_{ref1}$, that is, $\frac{1}{2}V_{cc}+|V_{thn0}|$, $\frac{1}{2}V_{cc}+\frac{1}{2}(|V_{thp0}|+|V_{thn0}|)$, or $\frac{1}{2}V_{cc}+V_{thp0}|$. A P-channel MOS transistor 246p which is connected between the intermediate potential output node 246out and a ground potential node 246b, and in which its gate is connected to a reference potential node 246QP and its back gate is connected to the source potential node 246a, the controlled potential generation circuit 246 outputs any of the three kinds of reference potential $V_{ref2}$, that is, $\frac{1}{2}-|V_{thp0}|$, $\frac{1}{2}-\frac{1}{2}(|V_{thp0}|+|V_{thp0}|+|V_{thn0}|)$ or $\frac{1}{2}V_{cc}-|V_{thn0}|$.

This intermediate potential generation circuit is also different from those shown in FIG. 4 to FIGS. 7 and 8, in the aspect that the back gate of the P-channel MOS transistor 246P is connected not to the gate but to the source potential node 246a. Accordingly, the absolute value of the threshold voltage of the P-channel MOS transistor 246P is $|V_{thpp}|$ which is larger than $|V_{thp0}|$ and $|V_{thp}|$. As a result, the potential of the intermediate potential output node 246out attains an intermediate potential between $V_{ref1}-|V_{thn0}|$ and $V_{ref2}+|V_{thpp}|$. More specifically, when the controlled potential generation circuit 246 is arranged as shown in FIG. 4 or FIG. 5, the potential attains an intermediate level between $\frac{1}{2}V_{cc}+|V_{thn0}|-|V_{thn0}|$ and $\frac{1}{2}V_{cc}-|V_{thp0}|+|V_{thpp}|$; when arranges as shown in FIG. 6, the potential attains an intermediate level between $\frac{1}{2}V_{cc}+\frac{1}{2}(|V_{thp0}|+|V_{thn0}|)-|V_{thn0}|$ and $\frac{1}{2}V_{cc}-\frac{1}{2}(|V_{thp0}|+|V_{thn0}|)+|V_{thpp}|$; and when arranged as shown in FIG. 7, the potential attains an intermediate level between $\frac{1}{2}V_{cc}+|V_{thp0}|-|V_{thn0}|$ and $\frac{1}{2}V_{cc}-|V_{thn0}|+|V_{thpp}|$.

When the potential of the intermediate potential output node 246out is, as described above, an intermediate potential between $V_{ref1}-|V_{thn0}|$ and $V_{ref2}+|V_{thpp}|$, since the N-channel MOS transistor 246N is always in a conductive state while the P-channel MOS transistor 246P is in a non-conductive state, a through current flowing from the source potential node 246a to the grounding potential node 246b through the N-channel MOS transistor 246N, intermediate potential output node 246out and P-channel MOS transistor 246P may be restrained, making it possible to obtain an intermediate potential generation circuit of small power consumption.

Furthermore, when the potential of the intermediate potential output node 246out is an intermediate potential between $V_{ref1}-|V_{thn0}|$ and $V_{ref2}+|V_{thpp}|$, since the N-channel MOS |transistor 246N and the P-channel MOS transistor 246P are both in a non-conductive state, it may be possible to prevent the output from oscillation about the intermediate potential, and the potential width of the intermediate potential output node 246out at which the N-channel MOS transistor 246N and the P-channel MOS transistor 246P are both in non-conductive state is enlarged as compared with the intermediate potential generation circuit shown in FIG. 8, resulting in more effective small power consumption.

I claim:

1. An intermediate potential generation circuit comprising: a controlled potential generation circuit including a voltage division circuit connected between a first potential node and a second potential node, and generating first and second output potentials;

a first polarity MOS transistor connected between said first potential node and an intermediate potential output node, and having a gate receiving the potential corresponding to said first output potential;

a second polarity MOS transistor connected between said intermediate potential output node and said second potential node, and having a gate receiving the potential corresponding to said second output potential; wherein the back gate of either one of the two MOS transistors is connected to the gate thereof, and the potential difference between said first potential node and second potential node is substantially equal to the summation of the respective threshold voltages of said both MOS transistors.

2. An intermediate potential generation circuit as set forth in claim 1, wherein the back gate of other one of the two MOS transistors is connected to the gate thereof.

3. An intermediate potential generation circuit as set forth in claim 1, wherein the back gate of other one of the two MOS transistors is connected to said intermediate potential output node.

4. An intermediate potential generation circuit as set forth in claim 1, wherein the back gate of other one of the two MOS transistors is connected to said first potential node.

5. An intermediate potential generation circuit as set forth in claim 1, said controlled potential generation circuit including in series:

first and second resistors, each of which has substantially the same value of resistance; and at least two MOS transistors, each of which is diode-connected in the same forward direction and having a back gate connected to a gate thereof.

6. An intermediate potential generation circuit as set forth in claim 5, said controlled potential generation circuit comprising:

a first series connected body connected between said first potential node and second potential node, including the first and second resistors and said at least two MOS transistors, which are of a first polarity;

a second series connected body connected between said first potential node and second potential node, including at least two second polarity MOS transistors each of which is diode-connect in the same forward direction and having a back gate connected to a gate thereof and third and fourth resistors each of which has same value of resistance; and said first potential generation node is connected to a connecting point between said first and second resistors and said second potential generation node is connected to a connecting point between said third and fourth resistors.

7. An intermediate potential generation circuit as set forth in claim 5, said constant voltage generation circuit comprising;

a series connected first resistor, first polarity MOS transistor, second polarity MOS transistor, and second resistor, connected between said first potential node and second potential node;

wherein said first potential generation node is connected to a connecting point between said first resistor and first polarity MOS transistor, and said second potential generation node is connected to a connecting point between said second resister and second polarity MOS transistor.

* * * * *